(12) United States Patent
Lang et al.

(10) Patent No.: US 6,320,268 B1
(45) Date of Patent: Nov. 20, 2001

(54) POWER SEMICONDUCTOR MODULE

(75) Inventors: Thomas Lang, Zürich; Benno Bucher, Meilen, both of (CH); Toni Frey, Singapore (SG)

(73) Assignee: ABB (Schweiz) AG, Baden (CH)

( * ) Notice: Subject to any disclaimer, the term of this patent is extended or adjusted under 35 U.S.C. 154(b) by 0 days.

(21) Appl. No.: 09/488,835

(22) Filed: Jan. 21, 2000

(30) Foreign Application Priority Data

Jan. 27, 1999 (DE) .............................................. 199 03 245

(51) Int. Cl.[7] .......................... H01L 23/48; H01L 23/52; H01L 29/40
(52) U.S. Cl. .......................... 257/785; 257/726; 257/727; 257/718; 257/719; 257/690; 257/602; 257/177; 361/787; 361/789
(58) Field of Search ..................... 257/785, 726, 257/718, 719, 177, 690, 502, 602, 727; 361/728, 717, 789

(56) References Cited

U.S. PATENT DOCUMENTS 4,769,744 * 9/1988 Neugebauer et al. ............... 361/386
5,247,425 * 9/1993 Takahasi ............................... 361/717
5,842,512 * 12/1998 Guerrero .............................. 165/80.3
5,942,796 * 8/1999 Mosser et al. ....................... 257/712
6,058,014 * 5/2000 Choudhury et al. ................. 361/704

FOREIGN PATENT DOCUMENTS 31 52 040   8/1982  (DE) .
195 30 264  2/1997  (DE) .

* cited by examiner

*Primary Examiner*—Sara Crane
*Assistant Examiner*—Nitin Parekh
(74) *Attorney, Agent, or Firm*—Oblon, Spivak, McClelland, Maier & Neustadt, P.C.

(57) ABSTRACT

A power semiconductor module in which at least one semiconductor chip with which contact is made by pressure is electrically connected via a contact element to a main connection. The contact element has two planar contact surfaces, between which a spring element is located. Irrespective of the individual position and height of a chip, the respective spring element ensures a standard contact force. Overloading of the semiconductor chips when the module is being clamped in is prevented by ceramic supporting elements.

20 Claims, 2 Drawing Sheets

POWER SEMICONDUCTOR MODULE

TECHNICAL FIELD

The invention relates to the field of power electronics. It is based on a power semiconductor module according to the preamble of the first claim.

DISCUSSION OF THE BACKGROUND

Such a power semiconductor module has already been described in Laid-Open Specification DE 195 30 264 A1. This is a so-called pressure-contact semiconductor module, in which a plurality of semiconductor chips are arranged with their first main electrode on a base plate. The second main electrodes of the chips make electrical contact with a plurality of contact stamps. The base plate is connected to first main connection, and the contact stamp is connected to a second main connection.

It is difficult to solder the individual chips at the same level, and even harder to keep them plane-parallel. In the abovementioned Laid-Open Specification, the position of each individual contact stamp is set individually on the basis of the distance between the semiconductor chip with which contact is to be made, and the second main connection. This allows the requirements for plane-parallelity of the chips surfaces to be reduced. The position of the contact stamps, which are mounted such that they can move and are of a constant length, is set by means of a spring which is arranged in a hole provided to accommodate the contact stamps. The force acting on the module is transmitted to the individual semiconductor chips via these springs.

The solution specified in the abovementioned Laid-Open Specification has the disadvantage that the current must flow through the spring. The electrical conductivity of the spring itself and, in particular, that of the junction between the spring and the contact stamp or the second main connection, is, however, often inadequate.

SUMMARY OF THE INVENTION

The object of the present invention is to specify a power semiconductor module in which all the semiconductor chips have the same pressure applied to them irrespective of the distance between them and the second main connection, and in which the electrical conductivity of the means provided for making contact is improved. This object is achieved by a power semiconductor module having the features of the first claim.

The essence of the invention is to separate the means which are provided for the electrical connection between the semiconductor chips and the second main connection from the spring elements which are responsible for the standard contact force for all the semiconductor chips. An electrical connection for the second main connection of the module is provided for each semiconductor chip, and is distinguished by good conductivity and low contact resistances.

To this end, contact elements are provided which have two planar contact surfaces. The distance between these contact surfaces is bridged by a connecting element. This connecting element must be flexible and is preferably in the form of a clip or a wire-like conductor.

Each contact element is spread by a spring element. In this case, contact surfaces are pressed on the one hand against the cover plate and on the other hand onto the semiconductor chip, thus allowing a low contact resistance. The contact force is transmitted by the stressed spring element, which is arranged between the contact surfaces and contributes little or nothing at all to electrical conduction.

Power semiconductor modules having semiconductor chips with which contact is made by pressure are in general resistant to short circuits, since there are no thin bonding wires which can melt as a result of overloading. However, when contact is made by pressure, the sensitive semiconductor chips, in particular IGBT (Insulated Gate Bipolar Transistor) chips are subjected, without special precautionary measures, to unacceptable mechanical loading or mechanical overloading, which can lead to destruction of the chips. Damage can occur in particular when modules connected in series are clamped in a stack. In one preferred embodiment of the present invention, this is avoided by providing supporting elements between the first and the second main connections, in order to absorb any overloading. These supporting elements limit the spring movement and thus the maximum contact force transmitted by the spring element. As soon as the cover plate is in contact with the supports, any further load is absorbed by them, and the contact pressure on the semiconductor chips is decoupled from the external clamping-in load.

According to a further preferred embodiment, the units formed from the spring and contact elements can be prefabricated, and can easily be placed on the chips while the semiconductor module is being fitted. The said unit is even more compact and easier to handle if the spring element is prestressed by using suitable restraining means to prevent it from being completely relieved of stress. This allows, in particular, more economic and thus simpler production of the semiconductor modules.

The contact with the chips by means of the combination of a contact element and spring element according to the invention ensures a permanent, low impedance contact resistance between the casing contacts and the chip. In consequence, if a chip fails, the entire nominal current is passed via the defective chip without damaging the corresponding contacts.

Further advantageous embodiments are evident from the dependent claims.

BRIEF DESCRIPTION OF THE DRAWINGS

The invention will be explained in more detail in the following text with reference to exemplary embodiments and in conjunction with the drawings, in which.

The reference symbols used in the drawings, and their meanings, are summarized in the List of Reference Symbols. In principle, identical parts have the same reference symbols, except where repetition of a reference symbol has been dispensed with for reasons of clarity.

DESCRIPTION OF THE PREFERRED EMBODIMENTS

Figure 1:
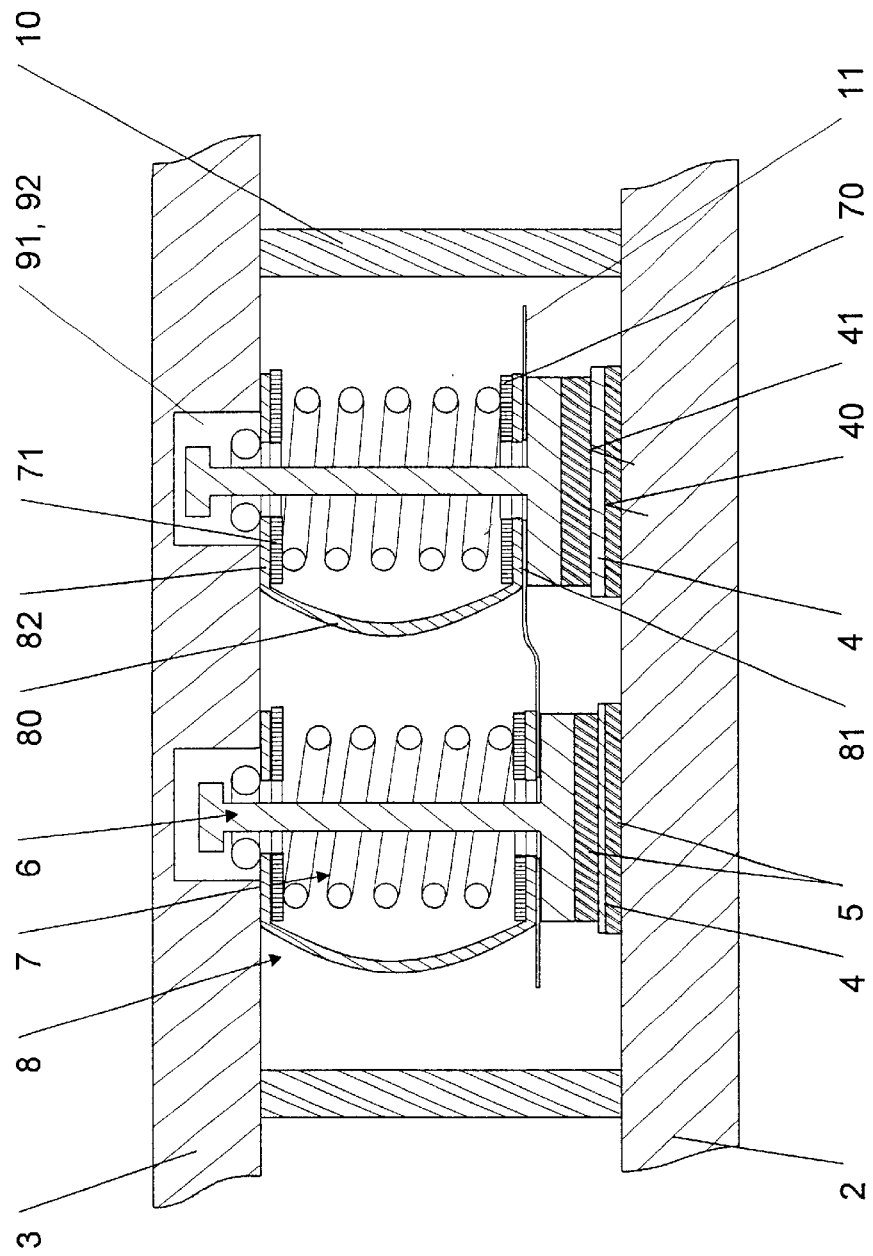
FIG. 1 shows a section through a part of a first embodiment of a power semiconductor module according to the invention.

FIG. 1 shows a detail from a section through a high-power semiconductor module according to a preferred embodiment of the invention. A large number of individual semiconductor chips 4 are arranged isolated from one another in a common casing, with only two individual chips 4 being illustrated in FIG. 1. The semiconductor chips are preferably IGBT chips or diode chips, or a combination of these two types of chips. FIG. 1 does not show the gate connections for driving the semiconductor chips.

The casing is formed by a base plate 2, a cover plate 3 and a casing wall. The base plate 2 (which forms a first main connection 20 of the module) and the cover plate 3 (which forms a second main connection 30 of the module) may be in the form of solid copper blocks. Furthermore, cooling apparatuses that are not shown here are integrated in the base plate 2. The semiconductor chips 4 comprise a first 40 and a second 41 metallized main electrode on the upper surface and lower surface. The second main electrode 41 of each semiconductor chip is electrically connected via a contact element 8 to the cover plate 3. Further films, foils, plates and/or solder layers may be provided between the first main electrode 40 and the base plate 2 on the one hand, and between the second main electrode 41 and the contact element 8 on the other hand. As an example of such an intermediate layer, plates 5 are shown whose thermal expansion is matched to the silicon semiconductor material, and which are manufactured from materials such as Mo, Cu or Mo—Cu composites.

In order to keep the contact resistance between the second main electrode 41 of a semiconductor chip 4 and the contact element 8 low, the latter comprises a first planar contact surface 81. This rests on the second main electrode 41 or on the topmost of the said intermediate layers 5. A spring element 7 is arranged in such a manner that the contact element 8 is spread by the spring element 7. A second planar contact surface 82 of the contact element 8 is accordingly pressed by the stressed spring element 7 against the cover plate 3. A first 70 and a second 71 washer are located between the spring element 7 and the two contact surfaces 81, 82. These washers 70, 71 are designed to be electrically insulating, so that no current whatsoever will flow through a metallic spring element 7 either.

The contact force transmitted by the stressed spring element 7 to the semiconductor chips 4 and the cover plate 3 is compensated for by the pressure which is exerted on the main connecting surfaces 20, 30 of the module when it is clamped in.

Since the distance between the two contact surfaces 81, 82 of the contact element 8 no longer changes once the module has been clamped in, it must be bridged by a flexible conductive connecting element 80. In particular, the spring element 7 is a module which is expanded more before being fitted, that is to say it is less stressed, than once it has been clamped in. The connecting element 80 may, for example, be in the form of a clip, comprise a plurality of clips, or be formed from one or more pieces of wire. The connecting element 80 according to the invention is used exclusively for electrical conduction.

As already mentioned initially, the height of the stack which in each case comprises a semiconductor chip 4 as well as molybdenum plates 5 and solder layers within a module, is not standard. Difficulties result in each case in aligning all the topmost intermediate layers, with which contact is to be made by the first contact surface 81 of the contact element 8, at exactly the same height. This is particularly true when different types of chips are used in one and the same module. In order to illustrate the problem, FIG. 1 shows the chips of different thickness in an emphasized form. The distance which is bridged by the contact element accordingly differs from chip to chip and from contact element to contact element. However, this problem no longer exists as a result of the use of the contact elements 8 according to the invention having a flexible extent, that is a variable distance between the contact surfaces 81, 82.

Supporting elements 10 composed of creep-resistant materials, preferably of ceramic, are provided in order to protect the semiconductor chips 4 against unacceptable mechanical loads and mechanical overloading. Specifically, if the pressure on the main connecting surfaces 20, 30 becomes excessive when the module is being clamped in a stack, the pressure can be absorbed by the supporting elements 10. The spring element 7 is further compressed while the module is being clamped in, to be precise at most until the cover plate 3 rests on the supporting elements 10. Any further overloading or unacceptable loading is thus no longer passed onto the semiconductor chips 4. The supporting element 10 may be in the form of individual posts or in the form of a supporting ring in the interior of the module, or may be identical to the casing wall.

A further example of the intermediate layers mentioned initially is the plate which is called the stamp foot 60 in the following text. This is used in addition to the first washer 70 to unify the pressure exerted by the spring element 7, and is provided between the spring element 7 and the chip 4. This is fitted in particular when the shape and size of the cross sections of the spring element 7 and semiconductor chip 4 do not match. The first contact surface 81 of the contact element 8 is then preferably located between the washer 70 on the chip side and the stamp foot 60.

This stamp foot 60 is additionally used as a base of an actual stamp 6. Such a stamp 6 furthermore comprises a stamp neck 61, and a broadened stamp head 62 adjacent to it. The object of a stamp 6 designed in such a way is to prevent all the stress from being removed from the spring element 7, or to ensure a certain amount of prestressing. Further restraining means 9 are also required for this purpose, for example an O-ring 90 underneath, which is placed between the stamp head 62 and the second washer 71 (or the second contact surface 82) on the cover plate side. This second washer 71 is provided with an opening whose diameter is somewhat larger than that of the stamp head 62. The O-ring 90 has an internal diameter which is smaller than the diameter of the stamp head 62, and an external diameter which is larger than the diameter of the opening in the second washer 71. The O-ring 90 which is clamped in in such a way between the stamp head 62 and the second washer 71 now prevents the unloaded spring element 7 from expanding beyond the stamp head 62. As an alternative to the above O-ring 91, a removable stamp head 62 is feasible, having a diameter which is larger than the diameter of the opening in the second washer 71.

Using these means, the spring element 7 may be given any desired prestress, thus minimizing the additional spring movement when the cover plate 3 is fitted and when the module is clamped in. The unit formed from a prestressed spring element 7, stamp 6 and contact element 8 can be produced as an autonomous, compact component, and may be inserted into the module as such.

Figure 2:
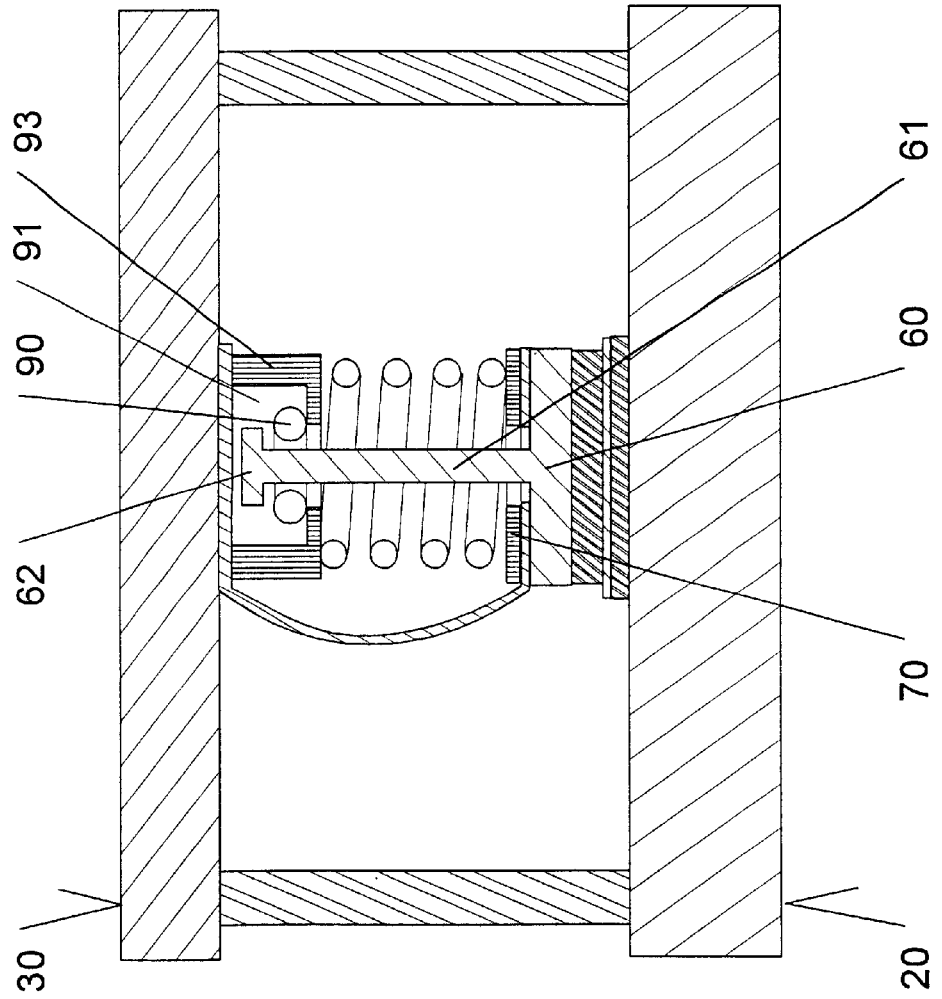
FIG. 2 shows a section through a part of a second embodiment of a power semiconductor module according to the invention.

When the cover plate 3 is being fitted and when the module is being clamped into the semiconductor stack, the spring element 7 is compressed somewhat further, as a result of which the distance between the stamp head 62 and the cover plate 3 is reduced. Accordingly, a stamp head chamber 91 must be provided in order to accommodate the relative movement between the stamp head 62 and the restraining means 9 or cover plate 3. This stamp head chamber 91 may be formed by a recess 92 in the cover plate 3 (FIG. 1 or by an L-shaped funnel-like profile element 93 which rests on the spring element 7, on the cover plate side. This embodiment is shown on a single chip in FIG. 2. In this case, there is no need to incorporate a recess in the cover plate 3. Furthermore, the second contact surface 82 is in this case designed to be continuous, and thus has a larger contact area.

The spring element 7 may be a spiral spring, may comprise one or more plate springs, or may be manufactured as a cylinder composed of an elastic material. Although the spring element 7 has always been compressed in the described examples, embodiments are also feasible in which it is loaded in tension. Furthermore, the spring element 7 does not necessarily need to enclose the stamp neck 61, but may also be arranged alongside it.

The stamp 6 and the spring element 7 may have a circular cross section in a plane parallel to the main connections 20, 30, that is to say they may be designed to be rotationally symmetrical. A compensation film 11, which is shown only in FIG. 1, connects the second main electrodes 41 on the semiconductor chips 4 to one another electrically and mechanically, and is used to compensate for different voltage and stress drops between the semiconductor chips.

LIST OF REFERENCE SYMBOLS

2 Base plate
20 1st main connection
3 Cover plate
30 2nd main connection
4 Semiconductor chip
40 1st main electrode
41 2nd main electrode
5 Molybdenum plates
6 Stamp
60 Stamp foot
61 Stamp neck
62 Stamp head
7 Spring element
70 1st washer
71 2nd washer
8 Contact element
80 Flexible connecting element, clip, wire
81 1st contact surface
82 2nd contact surface
9 Restraining means, prestressing means
90 O-ring
91 Stamp head chamber
92 Recess
93 Profile element
10 Supporting element
11 Compensation film

What is claimed is:

1. A power semiconductor module having an electrically conductive base plate, an electrically conductive cover plate and at least one semiconductor chip which is electrically connected by means of a first main electrode to the base plate and which is electrically connected by means of a second main electrode and via a sprung electrical contact element to the cover plate, characterized in that there is at least one spring element which spreads the at least one contact element into a shape which produces the electrical connection between the second main electrode and the cover plate.

2. The power semiconductor module as claimed in claim 1, wherein the contact element comprises two contact surfaces and a flexible electrical connecting element, in which case the first contact surface is electrically connected to the second main electrode, and the second contact surface is electrically connected to the cover plate, and wherein the spring element is arranged between the two contact surfaces (81, 82).

3. The power semiconductor module as claimed in claim 2, characterized in that, in order to prestress the spring element, means are provided which comprise a stamp having a stamp foot arranged between the spring element and the semiconductor chip, a stamp neck and a stamp head which is held in a stamp head chamber.

4. The power semiconductor module as claimed in claim 3, characterized in that the stamp foot is arranged between the first contact surface and the semiconductor chip.

5. The power semiconductor module as claimed in claim 4, characterized in that the stamp neck passes through the spring element.

6. The power semiconductor module as claimed in claim 5, characterized in that the stamp head chamber is formed by a recess in the cover plate, or an L-shaped profile element arranged between the spring element and the cover plate.

7. The power semiconductor module as claimed in claim 2, characterized in that the flexible connecting element has one or more deformable clips.

8. The power semiconductor module as claimed in claim A, characterized in that, in order to prestress the spring element, means are provided which comprise a stamp having a stamp foot arranged between the spring element and the semiconductor chip, a stamp neck and a stamp head which is held in a stamp head chamber.

9. The power semiconductor module as claimed in claim 8, characterized in that the stamp foot is arranged between the first contact surface and the semiconductor chip.

10. The power semiconductor module as claimed in claim 9, characterized in that the stamp neck passes through the spring element.

11. The power semiconductor module as claimed in claim 10, characterized in that the stamp head chamber is formed by a recess in the cover plate, or an L-shaped profile element arranged between the spring element and the cover plate.

12. The power semiconductor module as claimed in claim 1, characterized in that the spring element is a spiral spring, or comprises plate springs or a cylindrical component composed of an elastic material.

13. The power semiconductor module as claimed in claim 12, characterized in that, in order to prestress the spring element, means are provided which comprise a stamp having a stamp foot arranged between the spring element and the semiconductor chip, a stamp neck and a stamp head which is held in a stamp head chamber.

14. The power semiconductor module as claimed in claim 13, characterized in that the stamp foot is arranged between the first contact surface and the semiconductor chip.

15. The power semiconductor module as claimed in claim 1, characterized in that the spring element is electrically insulated from the contact element.

16. The power semiconductor module as claimed in claim 1, characterized in that there is at least one preferably ceramic supporting element between the base plate and the cover plate.

17. The power semiconductor module as claimed in claim 1, characterized in that, in order to prestress the spring element, means are provided which comprise a stamp (6) having a stamp foot arranged between the spring element and the semiconductor chip, a stamp neck and a stamp head which is held in a stamp head chamber.

18. The power semiconductor module as claimed in claim 17, characterized in that the stamp foot is arranged between the first contact surface and the semiconductor chip.

19. The power semiconductor module as claimed in claim 18, characterized in that the stamp neck passes through the spring element.

20. The power semiconductor module as claimed in claim 19, characterized in that the stamp head chamber is formed by a recess in the cover plate, or an L-shaped profile element arranged between the spring element and the cover plate.

* * * * *